(12) United States Patent
Anderson et al.

(10) Patent No.: US 7,939,766 B2
(45) Date of Patent: May 10, 2011

(54) APPARATUS FOR ELECTROMAGENTICALLY SHIELDING A PORTION OF A CIRCUIT BOARD

(75) Inventors: Robert B. Anderson, Largo, FL (US);
Michael A. Gilbert, Seminole, FL (US);
Mark W. Watson, New Port Richey, FL (US)

(73) Assignee: Honeywell International Inc., Morristown, NJ (US)

( * ) Notice: Subject to any disclaimer, the term of this patent is extended or adjusted under 35 U.S.C. 154(b) by 251 days.

(21) Appl. No.: 12/348,998

(22) Filed: Jan. 6, 2009

(65) Prior Publication Data

US 2010/0172115 A1   Jul. 8, 2010

(51) Int. Cl.
*H05K 9/00* (2006.01)
(52) U.S. Cl. .................................... 174/387; 361/816
(58) Field of Classification Search .............. 174/387, 174/377, 382, 384; 361/816, 818
See application file for complete search history.

(56) References Cited

U.S. PATENT DOCUMENTS

| | | | |
|---|---|---|---|
| 3,816,911 A * | 6/1974 | Knappenberger | 29/841 |
| 5,473,109 A * | 12/1995 | Plankl et al. | 174/363 |
| 5,504,659 A * | 4/1996 | Acatay et al. | 361/816 |
| 5,604,668 A * | 2/1997 | Wohrstein et al. | 361/816 |
| 6,037,846 A * | 3/2000 | Oberhammer | 333/182 |
| 6,063,999 A | 5/2000 | Kelly | |
| 7,215,558 B2 | 5/2007 | Schultz et al. | |
| 7,269,032 B2 | 9/2007 | Lungwitz | |
| 7,345,892 B2 | 3/2008 | Imazato et al. | |
| 7,369,191 B2 | 5/2008 | Okamoto et al. | |
| 7,422,481 B2 | 9/2008 | Togami et al. | |
| 7,433,203 B1 | 10/2008 | Yi et al. | |

* cited by examiner

*Primary Examiner* — Hung V Ngo
(74) *Attorney, Agent, or Firm* — Fogg & Powers LLC

(57) ABSTRACT

An apparatus for electrically shielding electronic components is provided. The apparatus includes a circuit board having a first surface with a plurality of electronic components mounted on the first surface, the first surface having a first region and a second region. The circuit board comprises a ground plane and a trace on the first surface coupled to at least one electronic component in the first region and coupled to at least one electronic component in the second region. The circuit board also comprising a strip of conductive material on the first surface, the strip of conductive material forming a perimeter around the first region of the circuit board, the strip of conductive material coupled to the ground plane, the strip of conductive material defining at least one gap wherein the trace is oriented through the at least one gap. Additionally, a first filtering device is coupled to the trace on a first side of the gap. The apparatus also includes a cover composed of a conductive material for the first region of the circuit board. The cover comprises a contact surface configured to contact the strip of conductive material on the circuit board. The contact surface has at least one notch. The at least one gap of the circuit board is configured to align with the at least one notch of the cover when the cover is installed on the circuit board.

19 Claims, 7 Drawing Sheets

APPARATUS FOR ELECTROMAGENTICALLY SHIELDING A PORTION OF A CIRCUIT BOARD

BACKGROUND

Due to the sensitivity of many electronic components, power from external sources is often filtered prior to use by the electronic components to remove unwanted noise from the power signal. Filtering is typically accomplished with a filtering unit as a module separate from the sensitive electronics which sends the filtered power to the sensitive electronic components. To provide additional protection for the sensitive electronic components, the components are contained within an electromagnetic shield that protects the components from external interference. In addition to providing protection for sensitive electronic components, the demand for smaller and lighter electronics requires the functionalities above to be accomplished in reduced size and space.

SUMMARY

In one embodiment, an apparatus for electrically shielding electronic components is provided. The apparatus includes a circuit board having a first surface with a plurality of electronic components mounted on the first surface, the first surface having a first region and a second region. The circuit board comprises a ground plane and a trace on the first surface coupled to at least one electronic component in the first region and coupled to at least one electronic component in the second region. The circuit board also comprising a strip of conductive material on the first surface, the strip of conductive material forming a perimeter around the first region of the circuit board, the strip of conductive material coupled to the ground plane, the strip of conductive material defining at least one gap wherein the trace is oriented through the at least one gap. Additionally, a first filtering device is coupled to the trace on a first side of the gap. The apparatus also includes a cover composed of a conductive material for the first region of the circuit board. The cover comprises a contact surface configured to contact the strip of conductive material on the circuit board. The contact surface has at least one notch. The at least one gap of the circuit board is configured to align with the at least one notch of the cover when the cover is installed on the circuit board.

DRAWINGS

Understanding that the drawings depict only exemplary embodiments of the present invention and are not therefore to be considered limiting in scope, the exemplary embodiments will be described with additional specificity and detail through the use of the accompanying drawings, in which.

In accordance with common practice, the various described features are not drawn to scale but are drawn to emphasize specific features relevant to the exemplary embodiments of the present invention.

DETAILED DESCRIPTION

The present disclosure is directed towards an apparatus for electromagnetically shielding a portion of a circuit board from other portions of the circuit board and from other external environmental noise. The shielded portion of the circuit board to be shielded has a strip of electrically conductive material on the surface of the circuit board surrounding the shielded portion. The strip of material has at least one gap through which a trace is oriented. The gap enables signals to enter and exit the shielded portion without shorting out on an electromagnetic shield that surrounds the shielded portion. A filtering device is coupled to at least one side of the trace to filter the signals entering the shielded portion on the trace. An electrically conductive cover is configured to cover the shielded portion and contact the strip of material surrounding the shielded portion. The cover in combination with a ground plane running through the circuit board forms a faraday cage around the shielded portion. The cover also has at least one notch which corresponds with the at least one gap in the strip of material. This enables the trace to travel through the gap without coupling to the cover.

Figure 1:
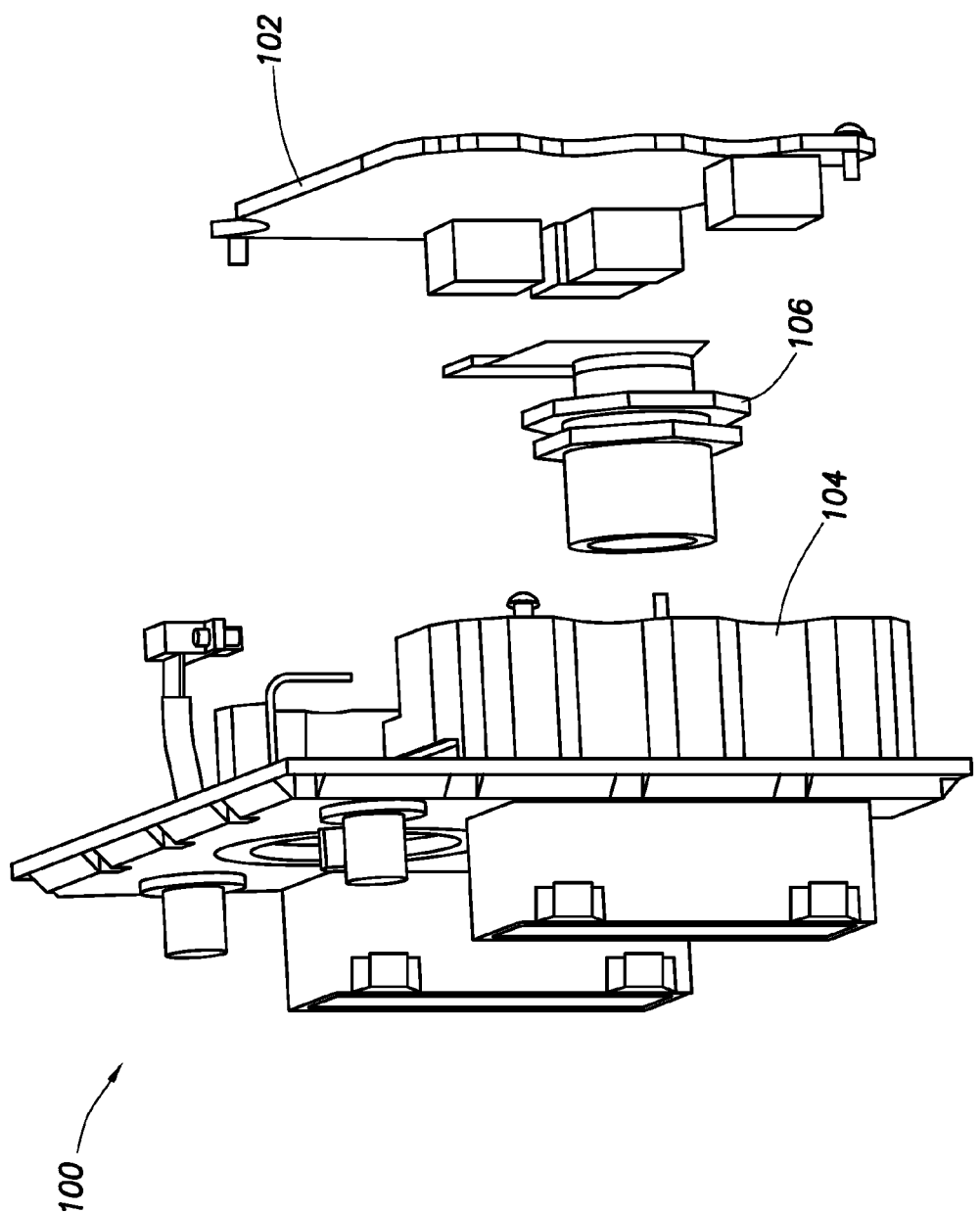
FIG. 1 is an exploded view of one embodiment of an apparatus for shielding a portion of a circuit board.

FIG. 1 is an exploded view of one embodiment of an apparatus 100 for shielding electronic components from noise external to the electronic components. Apparatus 100 comprises a circuit board 102, a cover 104, and an input jack 106. Circuit board 102 has a plurality of electronic components mounted thereon. Cover 104 is composed at least partially of an electrically conductive material. Cover 104 contacts circuit board 102 to form an electrical shield around at least a portion of the electronic components mounted on circuit board 102. The electrical shield is sometimes referred to in the art as a faraday cage. The shield surrounds the electronic components and is formed by cover 104 and by a conductive ground plane within circuit board 102. Gaps in the electrical shield enable signals to pass into/out of electrical shield to/from electronic components within the electrical shield.

Figure 2:
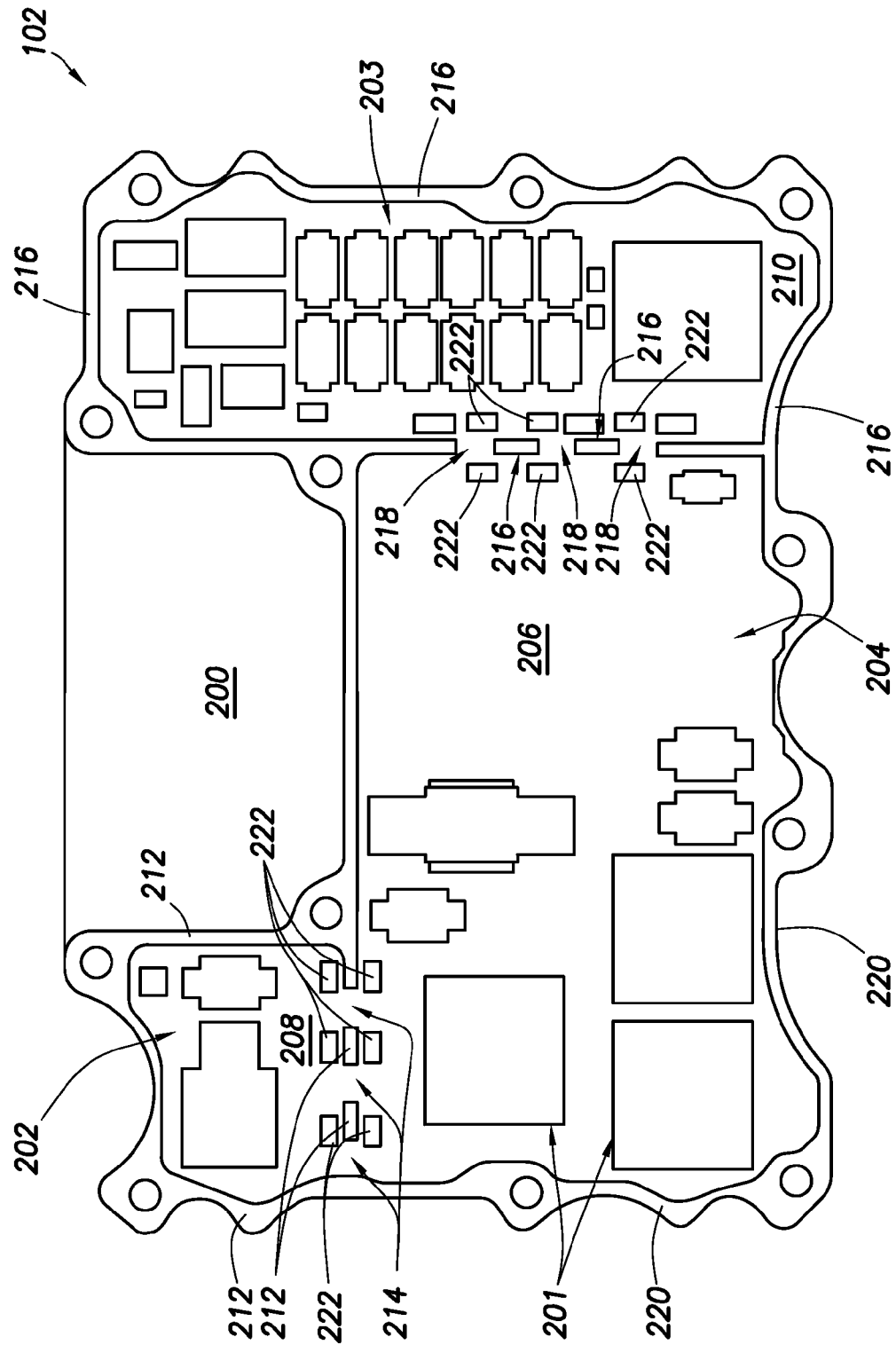
FIG. 2 is a top view of a circuit board for use in an apparatus for shielding a portion of a circuit board.

FIG. 2 is a top view of one embodiment of circuit board 102. Circuit board 102 comprises a substrate 200 to mechanically support and electrically couple various electronic components 201, 202, 203. Some or all of electronic components 201, 202, 203 are surface mounted devices which are soldered or otherwise electrically coupled to traces on an etched surface 204 of circuit board 102. In this embodiment, etched surface 204 of circuit board 102 is a surface of circuit board 102 having a plurality of traces and upon which electrical components 202 are mounted. Etched surface 204 of circuit board 102 is divided into a plurality of regions 206, 208, 210. Each region 206, 208, 210 comprises a plurality of electronic components 201, 202, 203. Additionally, in this embodiment, each region 206, 208, 210 is shielded from external electrical noise and from electrical noise of electrical components in other regions of circuit board 102. Although in this illustrative embodiment, circuit board 102 is shown having a particular size and shape and with a particular layout of electronic components 201, 202, 203, it should be understood, that circuit board 102 can be of any shape, size, or have any number or layout of electronic components.

Circuit board 102 is a multi-layered circuit board, with etched surface 204 as a first layer and an in board ground plane as a second layer. In other embodiments, additional layers may be included.

In this embodiment, regions 208 and 210 are "clean" regions in which electronic components are shielded from noise external to the regions, and input signals for the regions are filtered to remove unwanted noise. Region 206 is a "dirty" region in which input signals may contain noise and/or the electronic components are not shielded from noise external to region 206. Although region 206 is a "dirty" region, in this embodiment, region 206 is still shielded from external noise. To shield regions 208 and 210 from external noise an electrical shield is formed around each region. As mentioned above, signals input into regions 208 and 210 are filtered to remove noise that may interfere with the operation of electronic components within the regions 208, 210.

Region 208 on circuit board 102 comprises a plurality of electronic components 202. A strip 212 of electrically conductive material forms a perimeter around electronic components 202 in region 208. In one embodiment, strip 212 is metal plating. More specifically, in one embodiment, strip 212 is composed of copper. Strip 212 forms a solid perimeter around electronic components 202 with the exception of one or more gaps 214 where no conductive material of strip 212 is present. In this embodiment, three gaps 214 are shown. Between each gap 214, strip 212 continues as conductive material is present. Input and output signals travel through gaps 214 to communicatively couple electronic components 202 to other components outside of region 208.

Region 210 also has a strip 216 of electrically conductive material forming a perimeter around electronic components 203 within region 210. Strip 216 also has three gaps 218 through which input and output signals may travel to and from electronic components 203 within region 210.

Strips 212 and 216 are coupled to a ground plane within circuit board 102. In one embodiment, the ground plane is a solid sheet of metal that is in a layer of circuit board 102 below electronic components 202. The ground plane acts as part of the shield for electronic components 202, 203 from external noise. The ground plane is coupled to strips 212 and 216 in at least one location for each stand alone section of strips 212, 216. For example, strip 212 is coupled to the ground plane at least once for the main section and once for each of the two sections between gaps 214. In other embodiments, the ground plane extends only under regions 208 and 210 and does not extend completely under the other areas on circuit board 102.

Coupling strips 212 and 216 to the ground plane places strips 212, 216 at ground charge. This enables cover 104 to contact strips 212, 216 and also be placed at ground charge as explained below. Strips 212, 216 are coupled to the ground plane with vias that extend into circuit board 102. To increase the uniformity of the ground charge on strips 212, 216, a plurality of vias couple strips 212, 216 to the ground plane in many different locations. The more area in which vias couple strips 212, 216 to the ground plane, the more uniform the ground charge on strips 212, 216. The more area that is electrically coupled between strips 212 and 216 and the ground plane, the better the electrical shield.

In this embodiment, region 206 also has a strip 220 extending around its perimeter. Strip 220 is also coupled to the ground plane. Since region 206 is adjacent to regions 208 and 210, portions of strip 220 are combined with strips 212 and 216. Notably, gaps 214 and 218 and their respective adjacent portions of strips 212 and 216 are also used as strip 220 surrounding region 206. Filtering devices 222, shown adjacent to gaps 214 and gaps 218, filter signals traveling between regions 206 and 208 as well as between regions 206 and 210. Filtering devices 222 are explained in more detail below with respect to FIG. 3.

Figure 3:
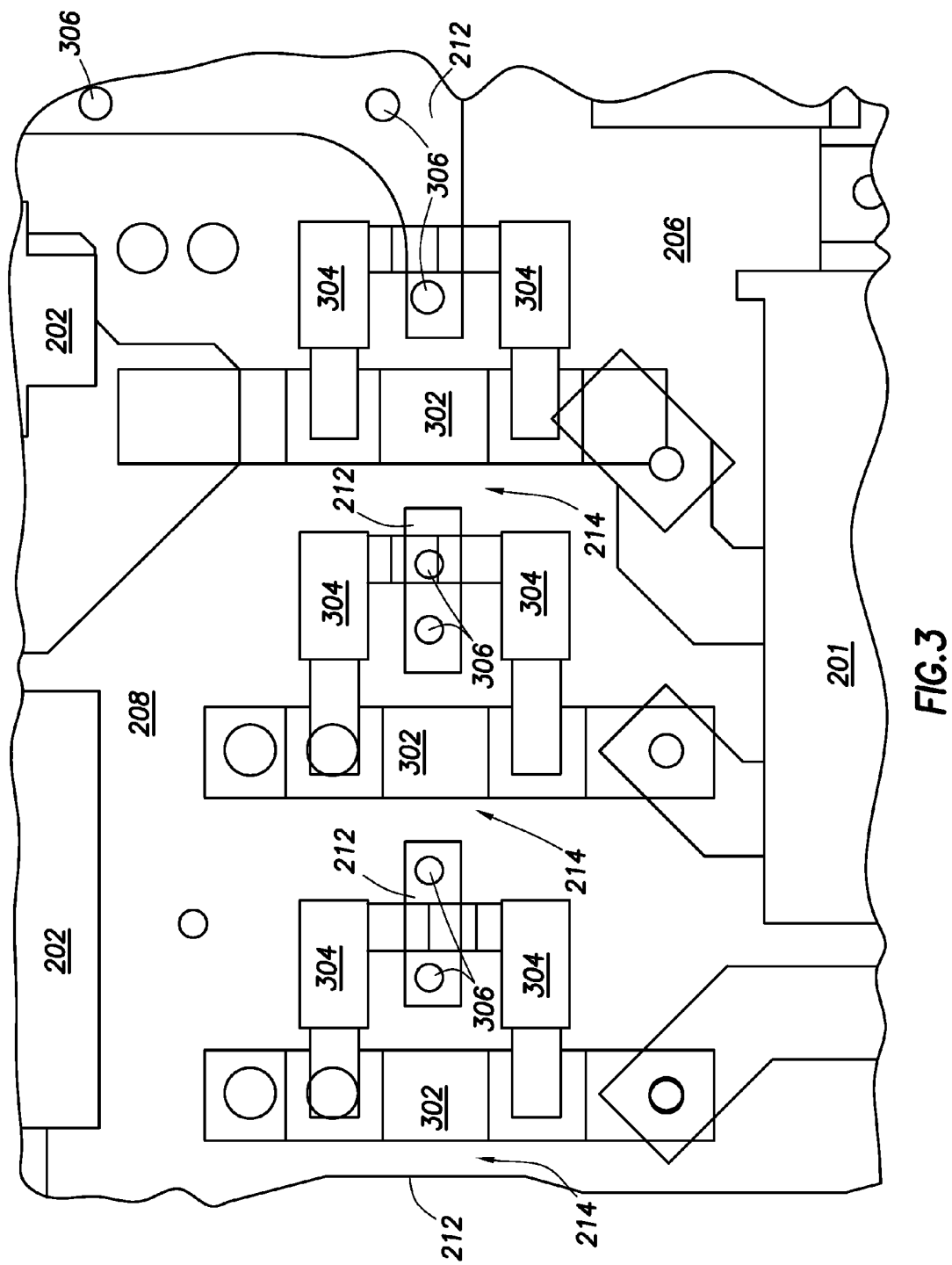
FIG. 3 is a close-up view of a portion of the circuit board of FIG. 2.

FIG. 3 is a close-up illustration of gaps 214 in the combined portion of strips 212 and 220 between regions 206 and 208. As shown in FIG. 3 the electrically conductive portion of strips 212 and 220 is non-contiguous, defining gaps 214 in which there is a space in the conductive material coupled to strip 212 on surface 204 of circuit board 102. For ease of explanation of FIG. 3, the combined portion of strips 220 and 212 is referred to below simply as strip 212. A trace 302 extends through each gap 214. Each trace 302 couples electronic components in region 206 to electronic components in region 208. Each trace 302 is a surface trace on surface 204 of circuit board 102. Gap 214 is of a width to enable trace 302 to pass therethrough without electrically coupling trace 302 to strip 212.

Coupled to each trace 302 on each side of each gap 214 is a filtering device 304. Each filtering device 304 filters signals traveling between region 206 and region 208 on the filtering device's 304 respective trace 302. For example, in this embodiment, each of the three traces 302 shown in FIG. 3 carry signals from region 206 to region 208. As mentioned above, region 206 may contain "dirty" signals. Region 208, however, is a "clean" area. Thus, the signals from region 206 are filtered by filtering devices 304 before they are used by electronic components 202 in region 208.

In one embodiment, filtering devices 304 are positioned immediately adjacent to their respective gaps 214. This aids in reducing the area in which environmental noise within region 206 can couple to trace 302 after the signal on trace 302 has been filtered by the filtering device 304 in region 208. Additionally, placing the filtering device 304 on the region 208 side of gap 214 close to gap 214 reduces the amount of area in which noise from trace 302 can propagate into region 208 before being removed by filtering device 304.

As shown in FIG. 3 filtering devices 304 are coupled on one end to trace 302 and are coupled on the other end to ground. Here, filtering devices 304 are coupled to a via 306 which is coupled to a ground plane (not shown) within circuit board 102. Vias 306 also couple conductive strip 212 to the ground plane.

During operation, signals from component 201 are sent into region 208 over one or more of traces 302. The signals leaving component 201 may contain noise from, for example, a noisy power supply, and/or environmental noises in region 208 that have coupled onto trace 302. Just prior to entering gap 214, the signals are filtered by filtering device 304. Filtering device 304 removes noise from the signal on trace 302. The signal on trace 302 then travels through gap 214. As mentioned above and explained in more detail below, region 208 is a "clean" region and is isolated from the noise of region 206 by an electrical shield (extending through strip 212) that surrounds region 208. The signals from region 206 enter region 208 through the electrical shield at gaps 214.

Thus, once the signal travels through gap 214 and enters into region 208 the signal (ideally) does not acquire addition unwanted environmental noise. Just after traveling through gap 214, the signal is filtered again by another filtering device 304 on the region 208 side of gap 214. This second filtering device 304 removes additional noise remnants from the signal on trace 302 as well as noise that may have coupled onto trace 302 after filtering by the first filtering device 304. Once the signal has been filtered by the second filtering device 304 in region 208, the signal is "clean" and travels on to its respective component 202 within region 208.

In one embodiment, filtering devices 304 remove only a portion of the noise on trace 302. Here, filtering devices 304 remove the portion of noise at a certain frequency or frequencies as desired based on what frequencies of noise affect components 202 within region 208. In one embodiment, noise on frequencies that do not have sufficient detrimental affect on components 202 is allowed to pass through gap 214. Of course, in other embodiments, any amount of noise may be removed from signals on traces 302 as desired for a particular application.

In one embodiment, filtering devices 304 are capacitors. Furthermore, in one embodiment, to filter out additional frequencies, more than one filtering device is coupled to each trace 302. Here, each of the filtering devices 304 coupled to each trace 302 removes a different frequency or frequencies from trace 302 or provides redundant filtering for a frequency or frequencies on trace 302.

Figure 4:
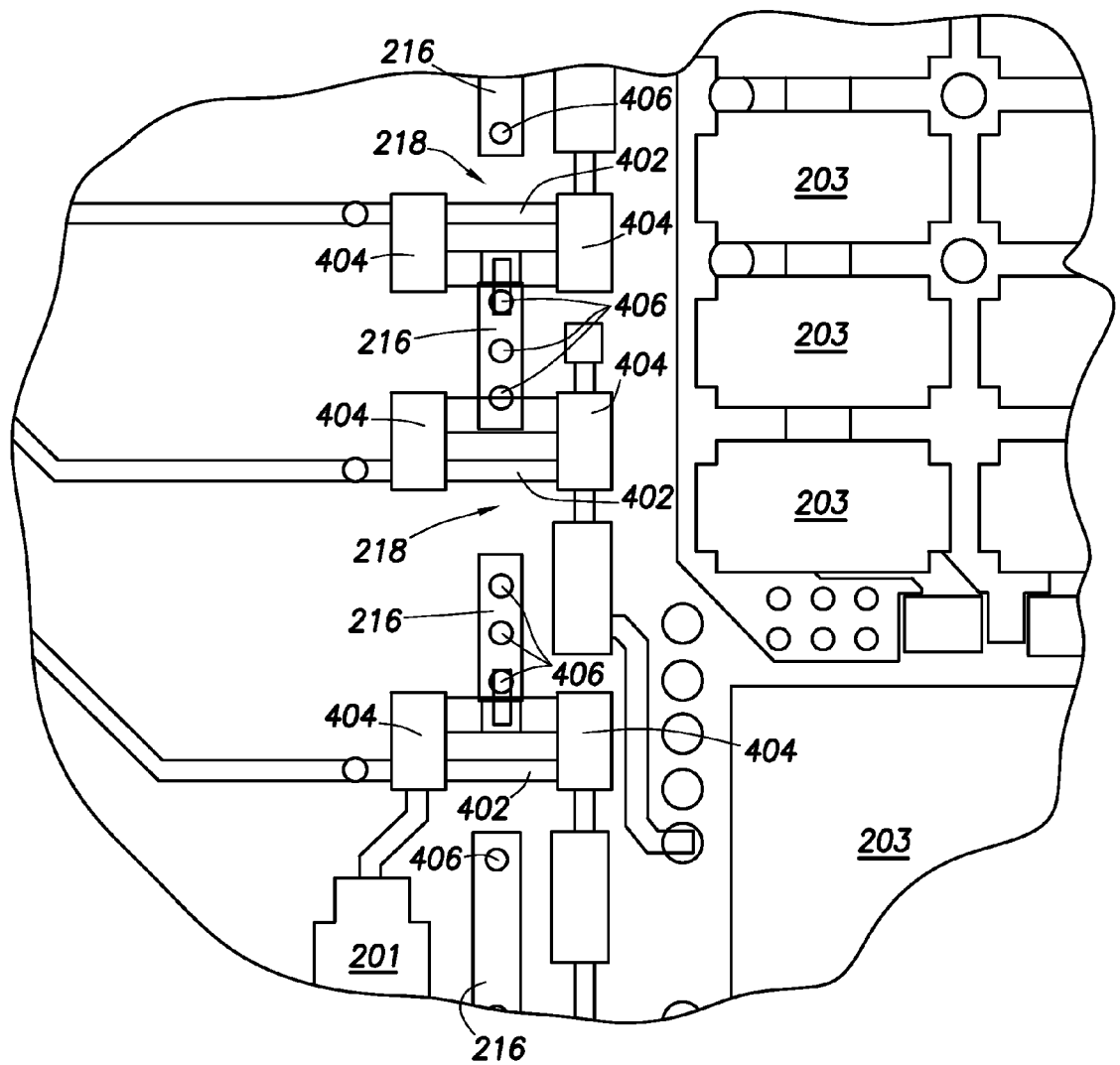
FIG. 4 is a close-up view of another portion of the circuit board of FIG. 2.

FIG. 4 is a close-up view of gaps 218 in the combined portion of electrically conductive strips 220 and 216 between region 206 and region 210. For ease of explanation of FIG. 4, the combined portion of strips 220 and 216 is referred to below simply as strip 216. Similar to that shown in FIG. 3, electrically conductive strip 216 defines a gap 218 in which there is a break in the conductive material of strip 216.

A trace 402 extends through each gap 218. Each trace 402 couples electronic components 201 in region 206 to electronic components 203 in region 210. Additionally, similar to FIG. 3, each trace 402 is a surface trace on surface 204 of circuit board 102.

A filtering device 404 is coupled to each trace 402 on each side of each gap 218. Filtering devices 404 filter signals traveling between region 206 and region 210. Similar to region 208, region 210 is a clean region. Thus, in this embodiment, filtering devices 404 filter signals traveling from region 206 to region 210. Also similar to FIG. 3, in this embodiment, filtering devices 404 are positioned on circuit board 102 as close as possible to their respective gaps 218. Filtering devices 404 are coupled on one side to trace 402 and on the other side to a via 406 which is coupled to the ground plane. Vias 406 also couple strip 216 to the ground plane within circuit board 102.

Similar to filtering devices 304, filter devices 404 may remove any frequency or frequencies of noise from trace 404 as desired for a particular application. Additionally, more than one filtering device 404 may be coupled to trace 402 on each side of gap 218. In one embodiment, filtering devices 404 are capacitors.

In one embodiment, region 206 contains electronic components 201 which convert power from an external power source (coupled to region 206 by input jack 106) into proper voltages for use by components within regions 208 and 210. Power from the external power source may contain noise that is detrimental to the performance of sensitive electronics within regions 208 and 210. Thus, regions 208 and 210 are shielded from the noise within the external power by an electrical shield surrounding each region and by filtering devices 304 and 404. As mentioned above, an electrical shield also shields the electronic components from other noise external to each region 208, 210. Electronic components 202 and 203 can therefore, operate in a "clean" environment with reduced environmental noise and reduced noise on the input power.

Figure 5:
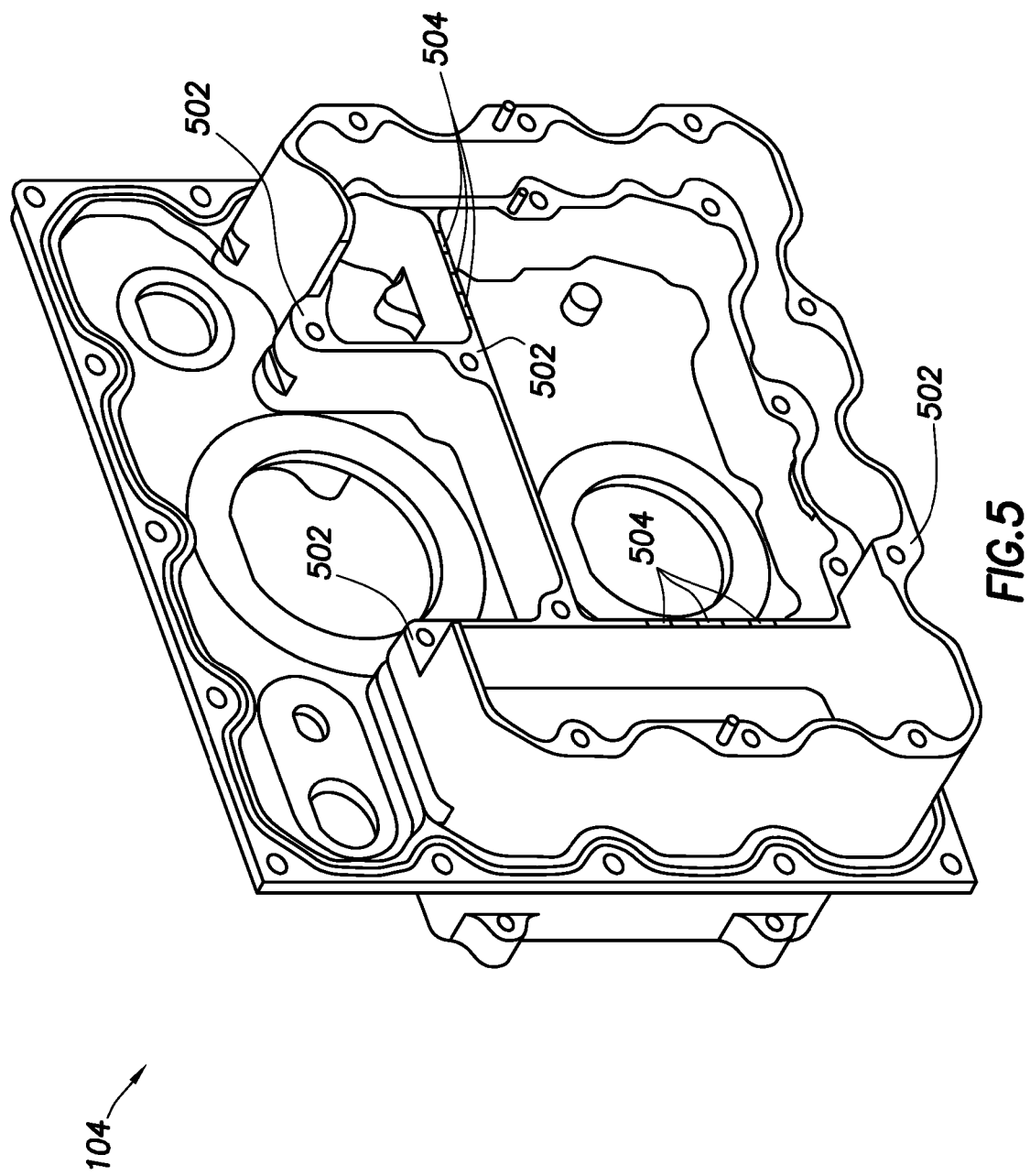
FIG. 5 is a perspective view of a cover for use in an apparatus for shielding a portion of a circuit board.

Referring now to FIG. 5, a perspective view of cover 104 is shown. Cover 104 comprises a contact surface 502. When circuit board 102 is connected to cover 104, contact surface 502 makes contact with strips 212, 216, 220 on circuit board 102. Contact surface 502 is composed of an electrically conductive material such that when contact surface 502 is in contact with strips 212, 216, 220 on circuit board 102, strips 212, 216, 220 are electrically coupled to cover 104.

As mentioned above, one portion of the electrical shield that is formed around each region 206, 208, 210 is formed by strips 212, 216, 220, vias 306, 406, and the ground plane within circuit board 102. The other portion of the electrical shield is formed by cover 104. Cover 104 is composed of an electrically conductive material of which contact surface 502 is a part thereof. Thus, when contact surface 502 couples to strips 212, 216, 220, cover 104 is electrically coupled to strips 212, 216, 220 (and thus the ground plane within circuit board 102) forming the second half of an electrical shield surrounding regions 206, 208, and 210. In one embodiment, cover 104 is composed of metal. In particular, in one embodiment, cover 104 is composed of aluminum.

Contact surface 502 comprises a plurality of notches 504. Notches 504 correspond to a matching gap 214, 218 on circuit board 102. In this embodiment, with the exception of notches 504, contact surface 502 is substantially flat such that contact surface 502 makes sufficient contact with strips 212, 216, 220.

Figure 6:
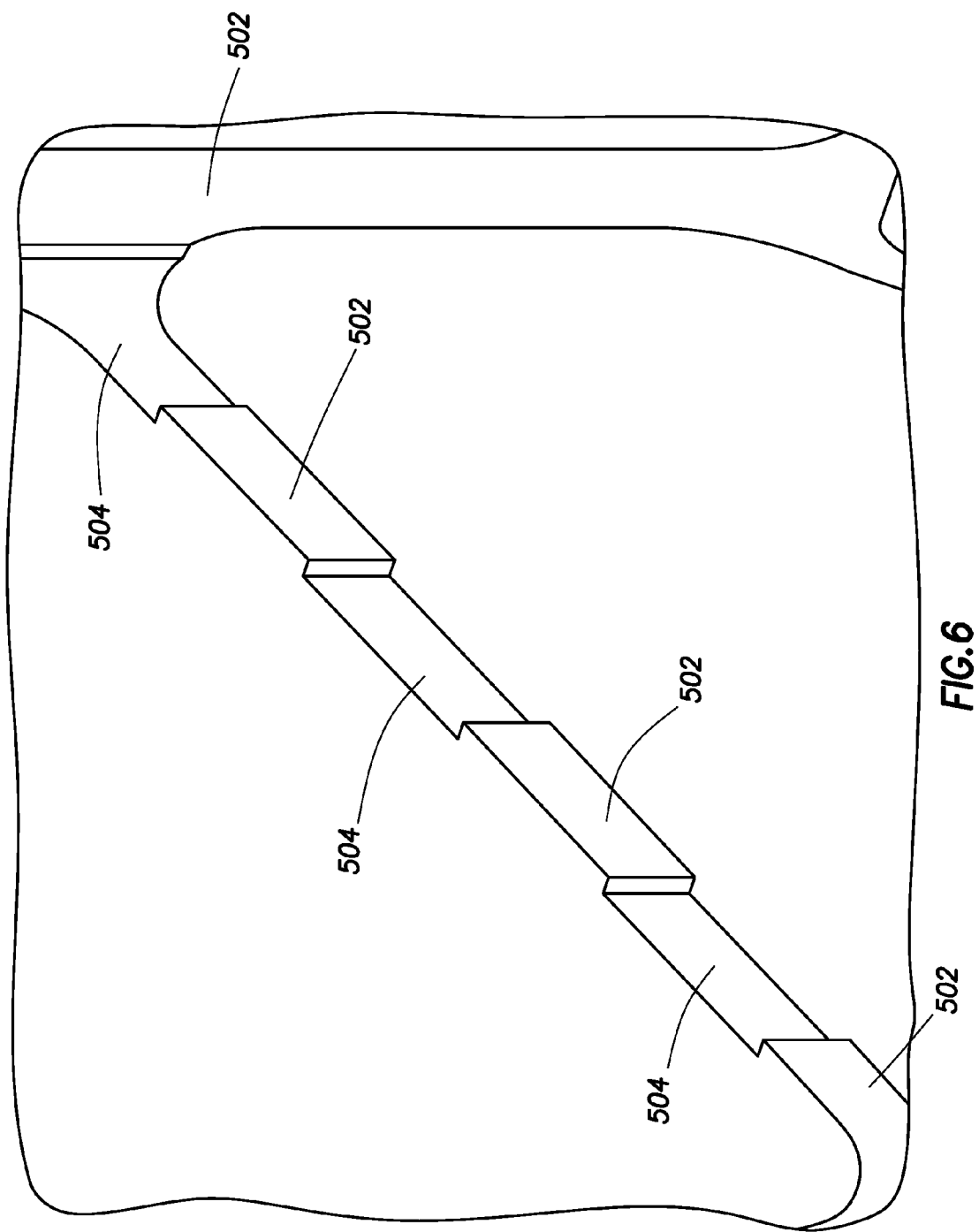
FIG. 6 is a close-up view of a portion of the cover of FIG. 5.

FIG. 6 illustrates a close-up view of cover 104 showing notches 504 in contact surface 502. As shown in FIG. 6, notches 504 provide clearance between cover 104 and circuit board 102 to enable traces 302, 402 to pass through gaps 214, 218. Notches 504 provide a recessed surface on cover 104 such that cover 104 does not contact circuit board 102 at gaps 214, 218. This enables traces 302, 402 to pass through gaps 214, 218. Electrically coupling cover 104 to strips 212, 216, 220 of circuit board 102 forms a ground shield around each region 206, 208, 210. Thus, the whole ground shield is made up of cover 104 on one half, and strips 212, 216, 220, vias 306, 406 and the ground plane within circuit board 102 on the other half.

The combination of gaps 214, 218 and notches 504 enables signals to pass through the ground shield and travel into and out of regions 206, 208, 210. Notches 504 are of depth and width to ensure that the electrically conductive cover 104 does not contact surface traces 302, 402. This would cause the signals on traces 302, 402 to short out. In order to reduce the amount of environmental noise that propagates through gaps 214, 218 and notches 504, notches 504 are recessed as little as possible such that cover 104 is as close as possible to traces 302, 402 while still ensuring that cover 104 does not electrically couple to traces 302, 402. In one embodiment, notches 504 are in the range of 3 to 50 thousandths of an inch recessed relative to contact surface 502. In particular, in one embodiment, notches 504 are 5 thousands of an inch recessed relative to contact surface 502.

Figure 7:
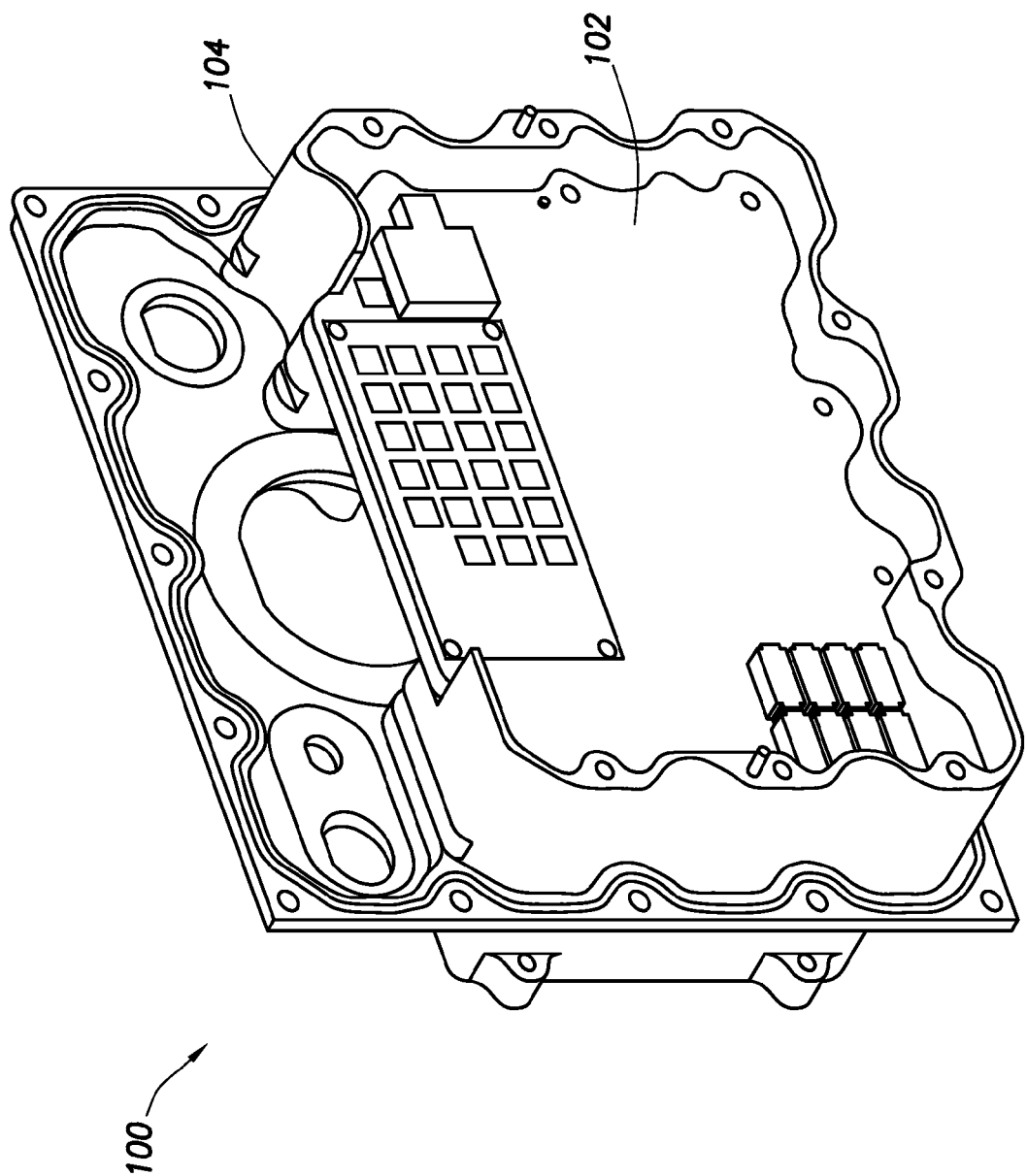
FIG. 7 is a perspective view showing the apparatus of FIG. 1 in an assembled form.

FIG. 7 is a perspective view of circuit board 102 with cover 104 installed thereon. Cover 104 is secured to circuit board 102 using a fastening device such as, for example, a bolt. Cover 104 is secured to circuit board 102 such that contact surface 502 of cover 104 is electrically coupled to strips 212, 216, 220 forming three ground shields, one ground shield around each of region 206, 208, 210. Advantageously, using notches 504 and gaps 214, 218 with filtering devices 304, 404 installed on each side of gaps 214, 218 simplifies assembly of apparatus 100. For example, no soldering is needed to install cover 104 and provide a ground shield around regions 206, 208, 210. Additionally, this enables filtering devices 304, 404 to be installed on circuit board 102 during assembly of circuit board 102. Furthermore, this simplifies assembly by enabling use of surface mount components for filtering devices 304, 404, as opposed to "pass through" filters which are installed in cover 104.

To manufacture apparatus 100, cover 104 is oriented relative to circuit board 102 such that contact surface 502 is aligned with strips 212, 216, 220 on circuit board 102. Furthermore, notches 504 in contact surface 502 are aligned with gaps 214, 218 in strips 214, 216, 220. Cover 104 is then brought into contact with circuit board 102 such that contact surface 502 contacts and is electrically coupled to strips 212, 216, 220. Cover 104 is then secured to circuit board 102 with a fastening device.

Although specific embodiments have been illustrated and described herein, it will be appreciated by those of ordinary skill in the art that any arrangement, which is calculated to achieve the same purpose, may be substituted for the specific embodiment shown. This disclosure is intended to cover any adaptations or variations of the present invention. Therefore, it is manifestly intended that this invention be limited only by the claims and the equivalents thereof.

What is claimed is:

1. An apparatus for electrically shielding electronic components, the apparatus comprising:
  a circuit board having a first surface with a plurality of electronic components mounted on the first surface, the first surface having a first region and a second region, the circuit board comprising:
   a ground plane;
   a trace on the first surface coupled to at least one electronic component in the first region and coupled to at least one electronic component in the second region;
   a strip of conductive material on the first surface, the strip of conductive material forming a perimeter around the first region of the circuit board, the strip of conductive material coupled to the ground plane, the strip of conductive material defining at least one gap wherein the trace is oriented through the at least one gap; and
   a first filtering device coupled to the trace on a first side of the gap; and
  a cover for the first region of the circuit board, the cover composed of a conductive material, the cover comprising:
   a contact surface configured to contact the strip of conductive material on the circuit board, wherein the contact surface has at least one notch;
  wherein the at least one gap is configured to align with the at least one notch when the cover is installed on the circuit board.

2. The apparatus of claim 1, wherein the circuit board further comprises:
  a second filtering device coupled to the trace on a second side of the gap.

3. The apparatus of claim 2, wherein the circuit board further comprises:
  a third filtering device coupled to the trace on the first side of the gap; and
  a fourth filtering device coupled to the trace on the second side of the gap.

4. The apparatus of claim 1, wherein the ground plane is a layer in the circuit board.

5. The apparatus of claim 1, wherein the first filtering device is a capacitor.

6. The apparatus of claim 1, wherein the first filtering device is a surface mount component.

7. The apparatus of claim 1, wherein the first filtering device is coupled to the trace immediately adjacent the gap.

8. The apparatus of claim 1, wherein the notch is offset from the contact surface in a range of 3 to 50 thousandths of an inch.

9. The apparatus of claim 1, wherein the cover is composed of metal.

10. A circuit board comprising:
  a first surface with a plurality of electronic components mounted on the first surface, the first surface having a first region and a second region;
  a ground plane under the first surface;
  a trace on the first surface coupled to an electronic component in the first region and coupled to an electronic component in the second region;
  a strip of conductive material on the first surface, the strip of conductive material forming a perimeter around the first region of the circuit board, the strip of conductive material coupled to the ground plane, wherein the strip of conductive material defines at least one gap;
  wherein the trace is oriented through the at least one gap; and
  a first filtering device coupled to the trace on a first side of the gap.

11. The circuit board of claim 10, wherein the circuit board further comprises:
  a second filtering device coupled to the trace on a second side of the gap.

12. The circuit board of claim 11, wherein the circuit board further comprises:
  a third filtering device coupled to the trace on the first side of the gap; and
  a fourth filtering device coupled to the trace on the second side of the gap.

13. The circuit board of claim 10, wherein the ground plane is a layer in the circuit board.

14. The circuit board of claim 10, wherein the first filtering device is a capacitor.

15. The circuit board of claim 10, wherein the first filtering device is a surface mount component.

16. The circuit board of claim 10, wherein the first filtering device is coupled to the trace immediately adjacent the gap.

17. A method of manufacturing an electronic device having an electrically shielded region, the method comprising:
  providing a circuit board having a plurality of electronic components mounted thereon, wherein the circuit board has a strip of electrically conductive material on a first surface of the circuit board that forms a perimeter around a first region of electronic components on the circuit board, the circuit board having ground plane that is coupled to the strip of electrically conductive material and also having a trace on the surface of the circuit board, the trace oriented through a gap in the strip of electrically conductive material, wherein the circuit board also has a first filtering device coupled to the trace on a first side of the gap;
  providing a cover for the first region of the circuit board, the cover composed of an electrically conductive material;
  orienting the cover such that a contact surface on the cover is aligned with the strip of electrically conductive material on the circuit board;
  placing the cover in contact with the circuit board such that the contact surface of the cover is electrically coupled to the strip of electrically conductive material on the circuit board, and such that a notch in the contact surface of the cover is aligned with the gap in the strip of electrically conductive material; and
  securing the cover to the circuit board.

18. The method of claim 17, wherein the cover is secured to the circuit board with a plurality of bolts.

19. The method of claim 18, wherein the circuit board has a second filtering device coupled to the trace on a second side of the gap.

* * * * *

UNITED STATES PATENT AND TRADEMARK OFFICE
CERTIFICATE OF CORRECTION

| | | |
|---|---|---|
| PATENT NO. | : 7,939,766 B2 | Page 1 of 1 |
| APPLICATION NO. | : 12/348998 | |
| DATED | : May 10, 2011 | |
| INVENTOR(S) | : Anderson et al. | |

It is certified that error appears in the above-identified patent and that said Letters Patent is hereby corrected as shown below:

On the front page, Section 54, Line 2, replace "ELECTROMAGENTICALLY" with --ELECTROMAGNETICALLY--

Signed and Sealed this
Fourteenth Day of February, 2012

David J. Kappos
*Director of the United States Patent and Trademark Office*

UNITED STATES PATENT AND TRADEMARK OFFICE
CERTIFICATE OF CORRECTION

| | | |
|---|---|---|
| PATENT NO. | : 7,939,766 B2 | Page 1 of 1 |
| APPLICATION NO. | : 12/348998 | |
| DATED | : May 10, 2011 | |
| INVENTOR(S) | : Anderson et al. | |

It is certified that error appears in the above-identified patent and that said Letters Patent is hereby corrected as shown below:

Title Page, Item (54) and at Column 1, line 2, in the title, replace "ELECTROMAGENTICALLY" with --ELECTROMAGNETICALLY--

This certificate supersedes the Certificate of Correction issued February 14, 2012.

Signed and Sealed this
Twentieth Day of March, 2012

David J. Kappos
*Director of the United States Patent and Trademark Office*